United States Patent
Chou

Patent Number: 6,015,728
Date of Patent: Jan. 18, 2000

[54] METHOD FOR FABRICATING SRAM POLYLOAD RESISTOR

[75] Inventor: Kuo-Yu Chou, Hsinchu, Taiwan

[73] Assignee: Winbond Electronics Corp., Taiwan

[21] Appl. No.: 09/055,580

[22] Filed: Apr. 6, 1998

[30]  Foreign Application Priority Data

Jan. 17, 1998 [TW]  Taiwan ................................. 87100591

[51] Int. Cl.[7] .............................................. H01L 21/8244
[52] U.S. Cl. ........................................... 438/238; 438/382
[58] Field of Search ............................ 438/238, 381–382

[56]  References Cited

U.S. PATENT DOCUMENTS

| | | |
|---|---|---|
| 5,705,418 | 1/1998 | Liu . |
| 5,705,436 | 1/1998 | Chin et al. ............................... 438/238 |

*Primary Examiner*—Jey Tsai
*Attorney, Agent, or Firm*—Blakely Sokoloff Taylor & Zafman

[57]  ABSTRACT

A method for fabricating a static random access memory polyload resistor comprising the steps of first providing a semiconductor substrate having a transistor formed thereon, wherein the transistor includes a gate, a source region and a gate region. Thereafter, a dielectric layer is formed over the substrate, and then photolithographic and etching processes are used to remove a portion of the dielectric layer forming a plurality of vias. Next, a polysilicon layer is formed over the substrate, and then photolithographic and etching processes are again used to pattern the polysilicon layer. Then, ions are doped to form a doped polysilicon layer. In the subsequent step, an anti-oxidation layer is formed over the substrate. Then, photolithographic and etching processes are again used to remove a portion of the polysilicon layer and the anti-oxidation layer forming interconnect regions and load resistor regions. Finally, a thermal oxidation is carried out followed by the removal of the anti-oxidation layer.

32 Claims, 16 Drawing Sheets

METHOD FOR FABRICATING SRAM POLYLOAD RESISTOR

CROSS-REFERENCE TO RELATED APPLICATION

This application claims the priority benefit of Taiwan application serial no. 87100591, filed Jan. 17, 1998, the full disclosure of which is incorporated herein by reference.

BACKGROUND OF THE INVENTION

1. FEILD OF INVENTION

The present invention relates to a method for fabricating a static random access memory (SRAM) polyload resistor. More particularly, the present invention relates to a method for fabricating a SRAM polyload resistor that utilizes lateral oxidation to reduce cross-sectional area in the load resistor region thereby increasing its resistance.

2. DESCRIPTION OF RELATED ART

In this electronic information age, SRAM is one of the most extensively used integrated circuit components in semiconductor manufacturing industry. Reduction of device dimensions without compromising quality so that more circuits can be packed inside a wafer is a common goal in the electronic industry. A load resistor is one major component in the fabrication of an SRAM cell. In general, a lightly doped or undoped polysilicon segment is used as a load resistor.

FIG. 1 is an equivalent circuit diagram of a conventional SRAM cell. As shown in FIG. 1, an SRAM cell comprises of two load resistors $R_1$ and $R_2$, two pull down transistors $Q_1$ and $Q_2$ and two access transistors $Q_3$ and $Q_4$. Transistors $Q_1$, $Q_2$, $Q_3$ and $Q_4$ utilize a first polysilicon layer as their gates. The high resistance portion of a second polysilicon layer acts as a load resistor, and the low resistance portion of the second polysilicon layer acts as an interconnect. In the conventional fabricating method, the same polysilicon layer is used to form interconnects as well as load resistors. To fabricate a segment of interconnect and a load resistor in the polysilicon layer, the specific segment for forming the interconnect is heavily doped or undoped. Then, an oxidation is performed on that particular segment where a load resistor is desired. Finally, the interconnect segment is heavily doped to lower its resistance. The interconnect and the load resistor together constitute a path for current to flow from power source $V_{cc}$ to node points A and B as shown in FIG. 1. The interconnect segments are thicker than the load resistor segments because the same polysilicon layer (that is, the second polysilicon layer) is used to form interconnects and load resistors.

To better understand the method and defects in the fabrication of a SRAM polyload resistor, an example is given below with reference to FIGS. 2A through 2P.

FIGS. 2A through 2P are cross-sectional views showing the progression of manufacturing steps in fabricating SRAM polyload resistor according to a conventional method.

First, as shown in FIG. 2A, a semiconductor substrate 110 is provided. Then, a conventional method is used to form a transistor in the substrate 110. The transistor comprises a gate 112, a gate dielectric layer 111 and N⁺source/drain regions 114 and 116. Thereafter, a dielectric layer 118 is formed over the semiconductor substrate.

Next, as shown in FIG. 2B, a patterned first photoresist layer 120 is formed over the dielectric layer 118 exposing a portion of the dielectric layer 118 above the source/drain region 114 and the gate 112.

Next, as shown in FIG. 2C, the exposed dielectric layer 118 is etched to form vias above the source/drain region 114 and the gate 112.

Thereafter, as shown in FIG. 2D, the first photoresist layer 120 is removed.

Subsequently, as shown in FIG. 2E, a polysilicon layer 60 is formed over the dielectric layer 118. Polysilicon layer 60 is then doped with ions to adjust its resistance, as shown in FIG. 2F. However, for some conventional fabricating methods, ion doping is deferred to a later stage.

Next, as shown in FIG. 2G, using photolithographic processing, a patterned second photoresist layer 62 is formed over the polysilicon layer 60 exposing a portion of the polysilicon layer 60 that needs to be removed.

Next, as shown in FIG. 2H, the exposed portion of the polysilicon layer 60 is etched to remove a segment of polysilicon layer 60 located between the source/drain region 114 and the gate 112, thereby forming an open circuit.

Next, as shown in FIG. 2I, the second photoresist layer 62 is removed. Subsequently, as shown in FIG. 2J, a chemical vapor deposition method is used to deposit a layer of silicon nitride at least covering the polysilicon layer 60. The silicon nitride layer serves as an anti-oxidation layer 64 serving a protective function.

Next, as shown in FIG. 2K, a patterned third photoresist layer 66 is formed over the anti-oxidation layer 64 exposing a portion of the anti-oxidation layer 64 that needs to be removed.

Thereafter, a shown in FIG. 2L, the exposed portion of the anti-oxidation layer 64 is etched away. Then, as shown in FIG. 2M, the third photoresist layer 66 is removed.

Next, as shown in FIG. 2N, a local oxidation of silicon (LOCOS) method is used to form a thermal oxidation layer 68 on the exposed polysilicon layer 60. During thermal oxidation, only the polysilicon layer segment not covered by an anti-oxidation layer will react. Consequently, the thickness of the polysilicon layer 60 underneath the thermally oxidized layer 68 will be reduced, and hence a load resistor segment 70 is formed. Furthermore, lateral oxidation will also take place during the thermal oxidation, and the width of the polysilicon layer 60 will be reduced as well.

Next, as shown in FIG. 2O, the anti-oxidation layer 64 is removed. Finally, as shown in FIG. 2P, ions are implanted into part of polysilicon layer 60 whose surface is not covered by any thermally oxidized layer 68, thereby lowering its resistance and forming the interconnect segment 72.

The above method of fabricating SRAM load resistor utilizes the same polysilicon layer so that interconnects are formed by heavily doping the desired segments, and the load resistor segments are formed by a LOCOS method covering the desired polysilicon segment so that the polysilicon below gets thinner. Therefore, a high load resistor is obtained without affecting the interconnect segments. However, one defect is that during local oxidation of the silicon, beside oxidation in the vertical dimension, oxidation also occurs in the lateral dimension. Hence, the thickness of underlying polysilicon layer and the lateral dimension will both be reduced. This can easily lead to circuit opening. Furthermore, the steps necessary for forming interconnects and load resistor according to the conventional method are quite complicated as well.

In light of the foregoing, there is a need to provide an improved method of forming interconnects and load resistors.

SUMMARY OF THE INVENTION

Accordingly, the present invention is to provide a simpler method for fabricating an SRAM polyload resistor that utilizes the lateral oxidation of polysilicon to form a polyload resistor segment having a higher resistance.

To achieve these and other advantages and in accordance with the purpose of the invention, as embodied and broadly described herein, the invention provides a method for fabricating SRAM polyload resistor. The method comprises the steps of first providing a semiconductor substrate having a transistor formed thereon, wherein the transistor includes a gate, a source region and a gate region. Thereafter, a dielectric layer is formed over the substrate, and then photolithographic and etching processes are used to remove a portion of the dielectric layer forming a plurality of vias. Next, a polysilicon layer is formed over the substrate, and then photolithographic and etching processes are again used to pattern the polysilicon layer. Then, the exposed portion of the polysilicon layer is doped to form a doped polysilicon layer. In the subsequent step, an anti-oxidation layer is formed over the substrate. Then, photolithographic and etching processes are again used to remove a portion of the polysilicon layer and the anti-oxidation layer forming interconnect regions and load resistor regions. Finally, a thermal oxidation is performed, followed by the removal of the anti-oxidation layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
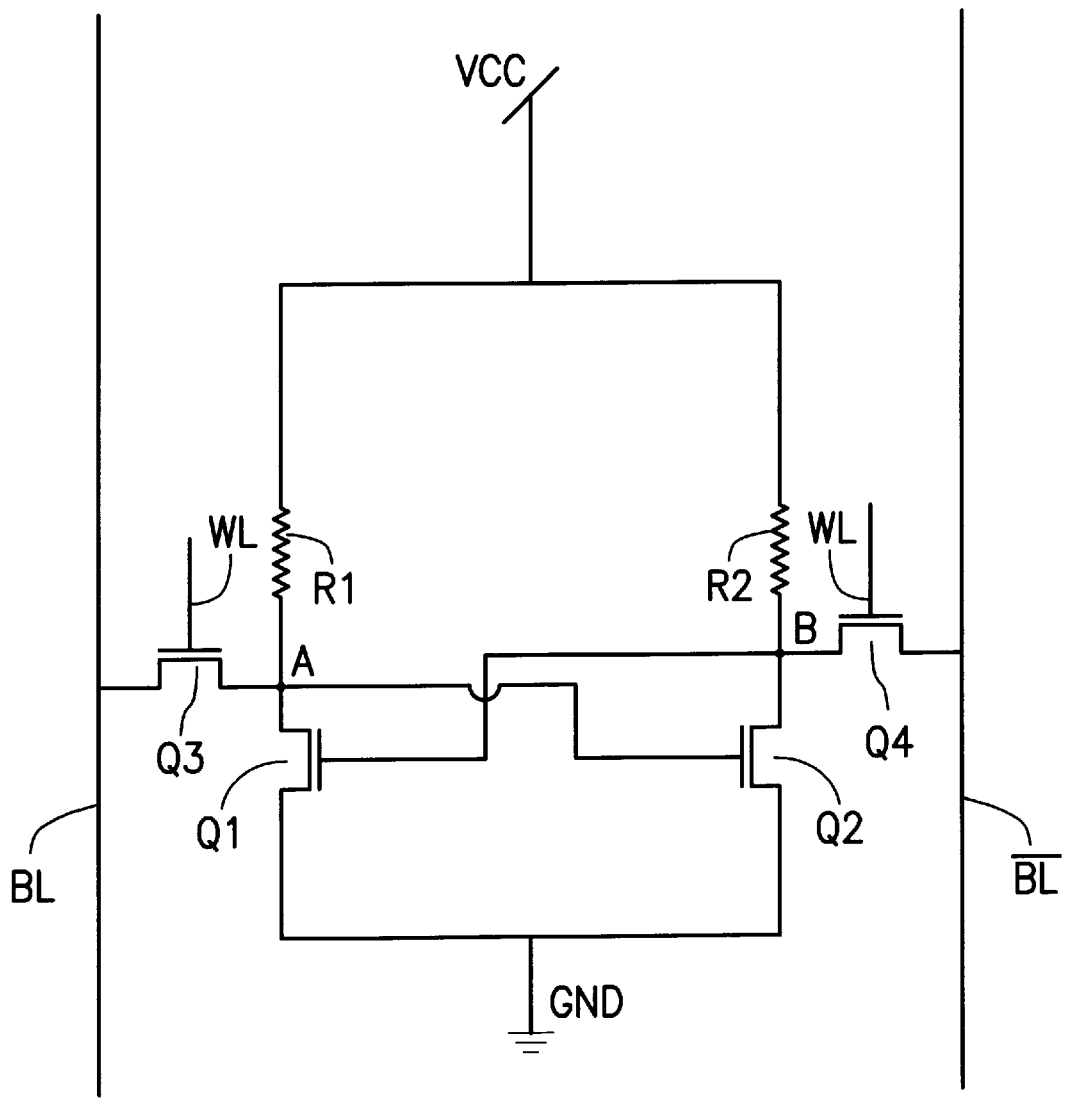
FIG. 1 is an equivalent circuit diagram of a conventional SRAM cell.
Figure 2A:
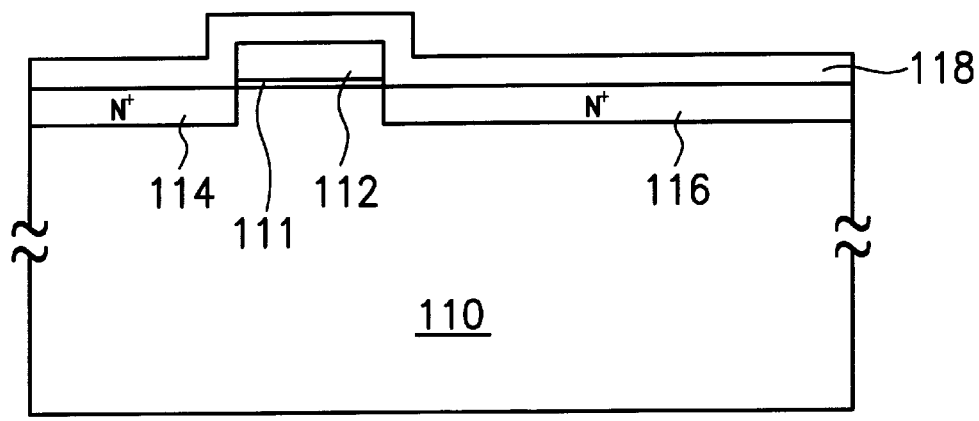
FIGS. 2A through 2P are cross-sectional views showing the progression of manufacturing steps in fabricating an SRAM polyload resistor according to a conventional method.
Figure 2B:
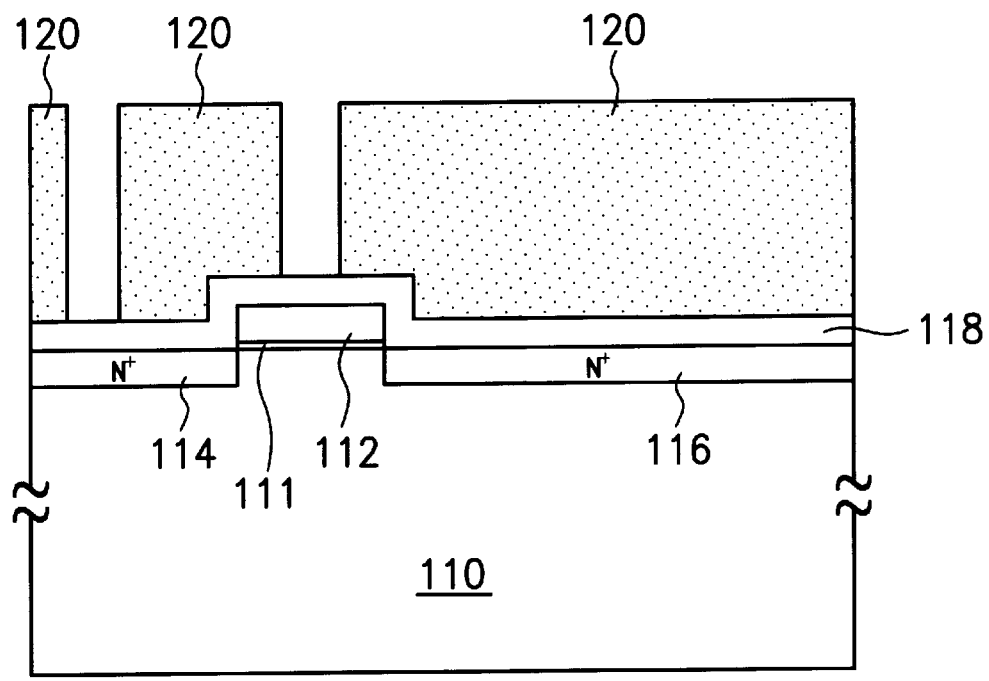
Figure 2C:
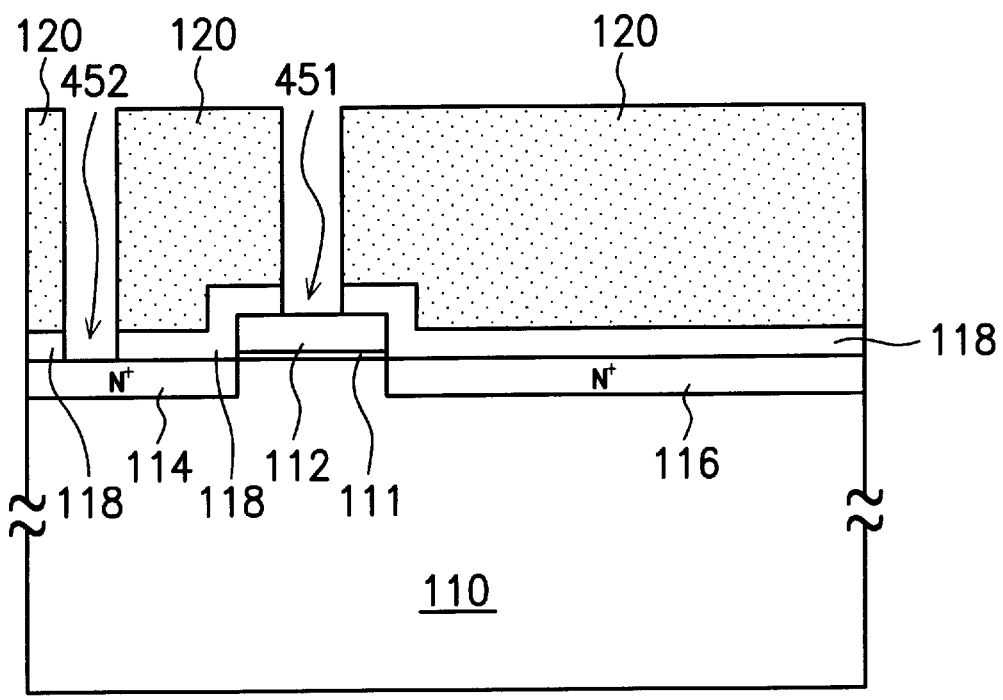
Figure 2D:
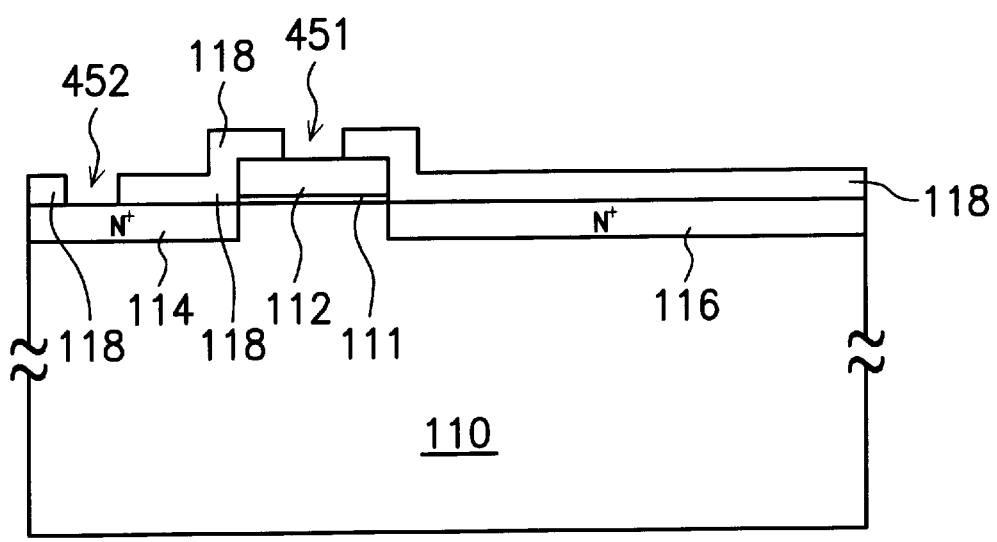
Figure 2E:
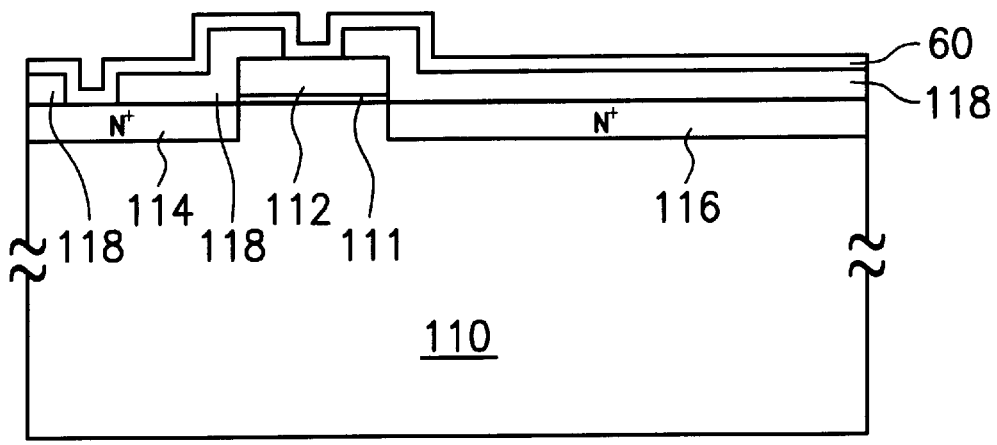
Figure 2F:
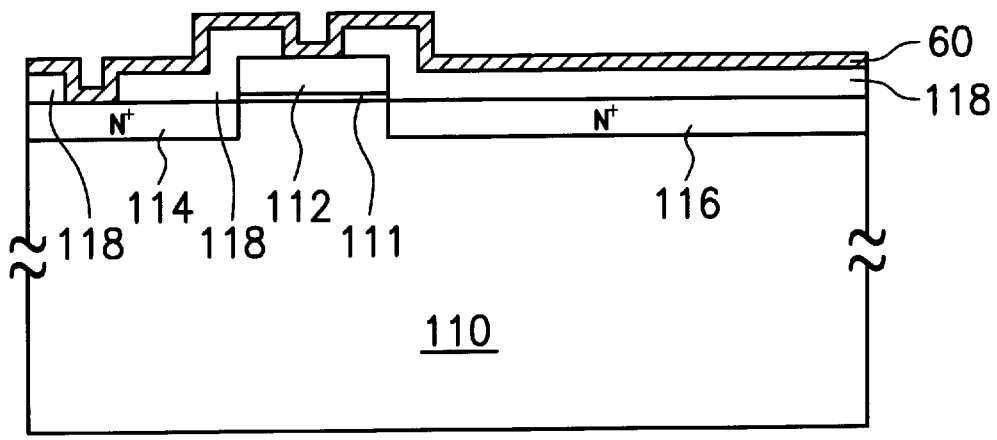
Figure 2G:
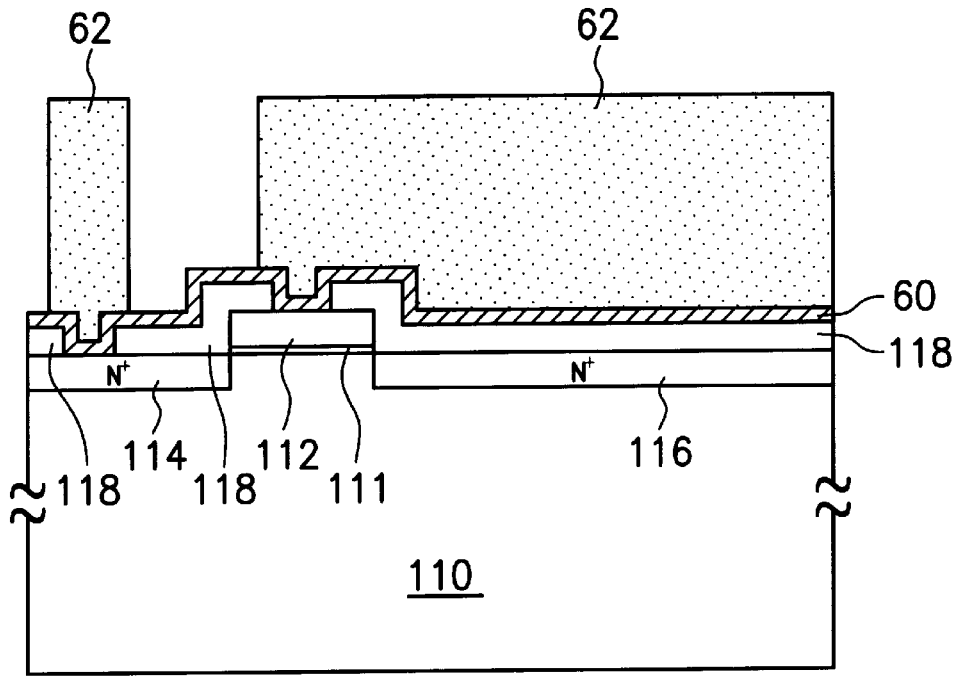
Figure 2H:
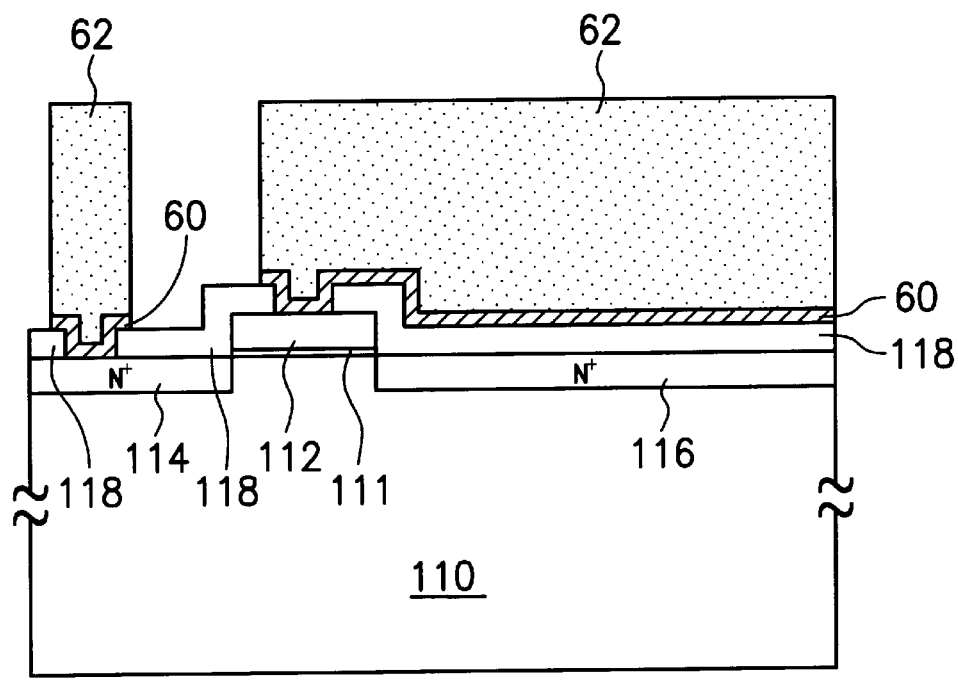
Figure 2I:
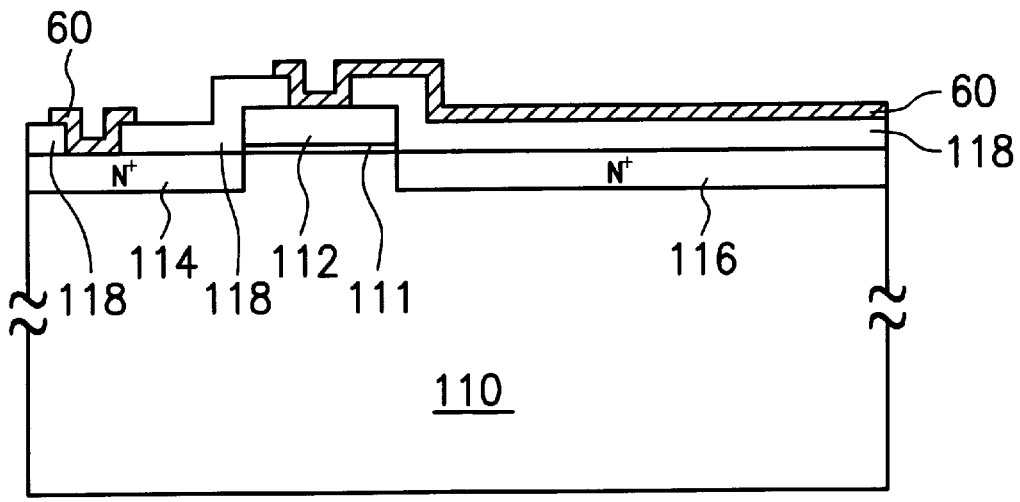
Figure 2J:
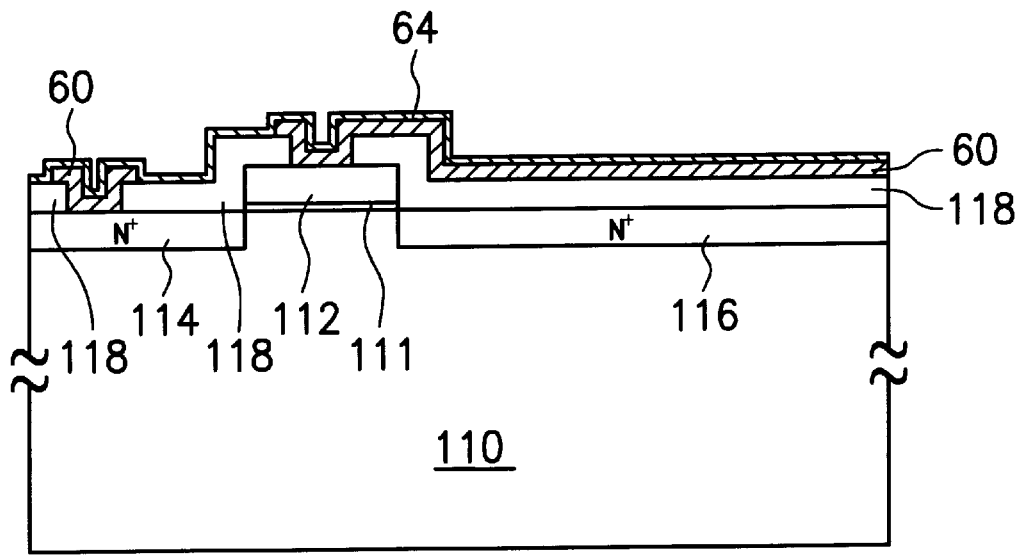
Figure 2K:
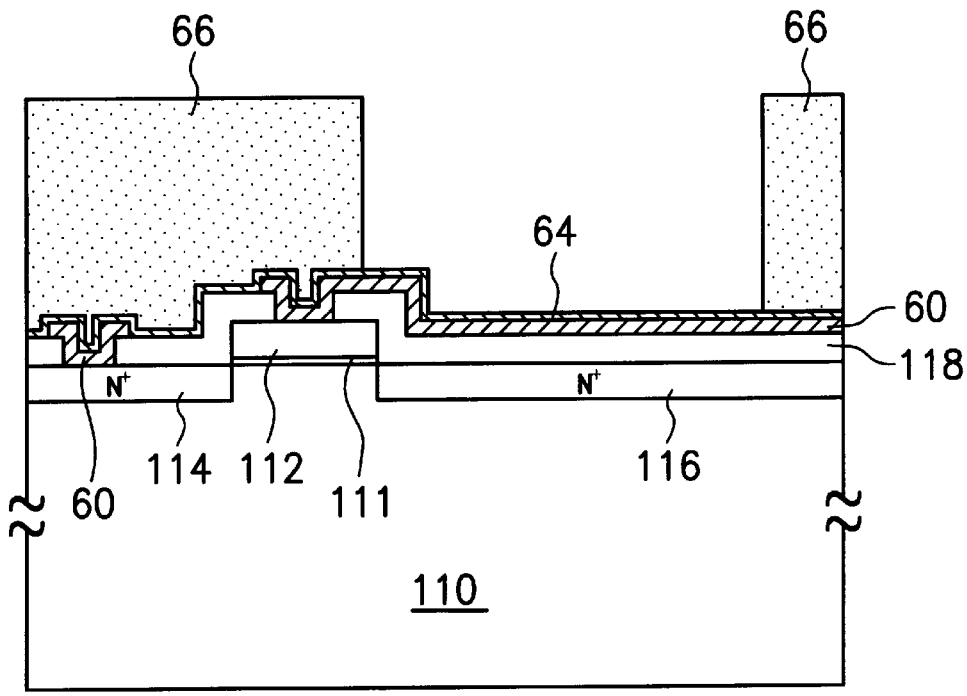
Figure 2L:
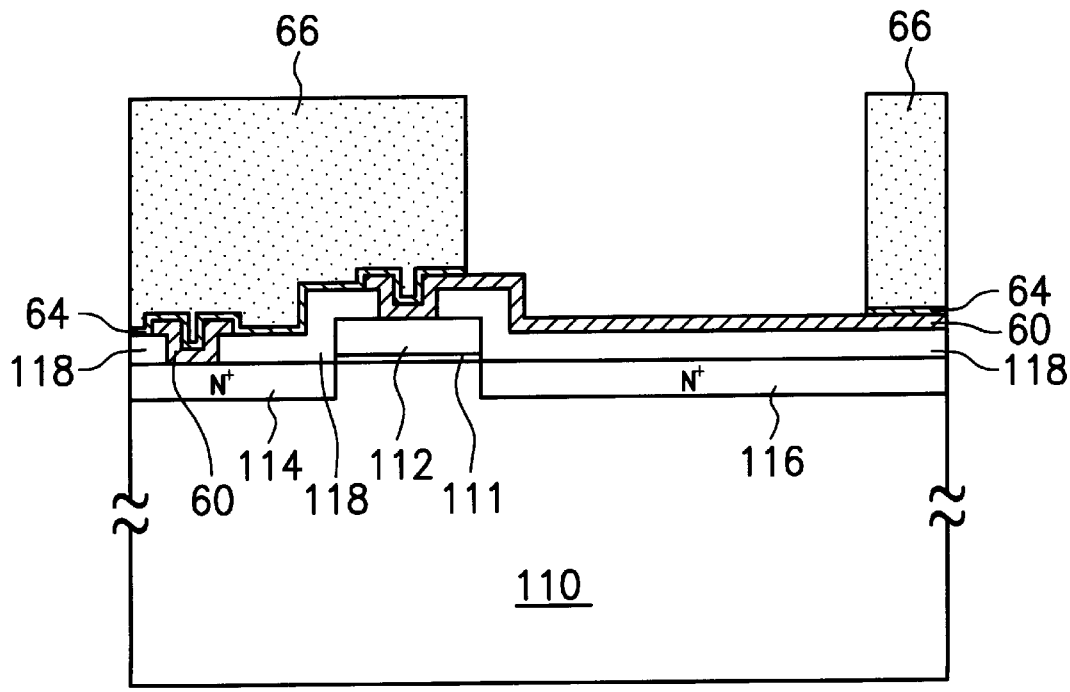
Figure 2M:
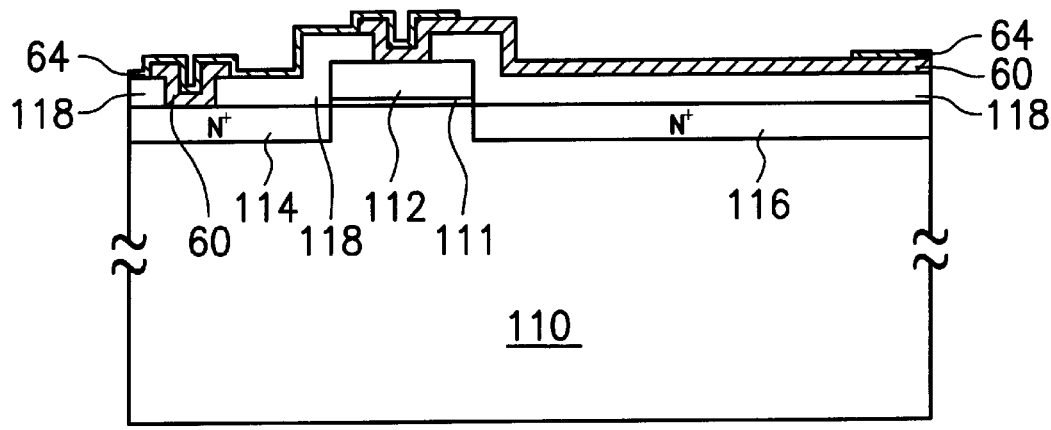
Figure 2N:
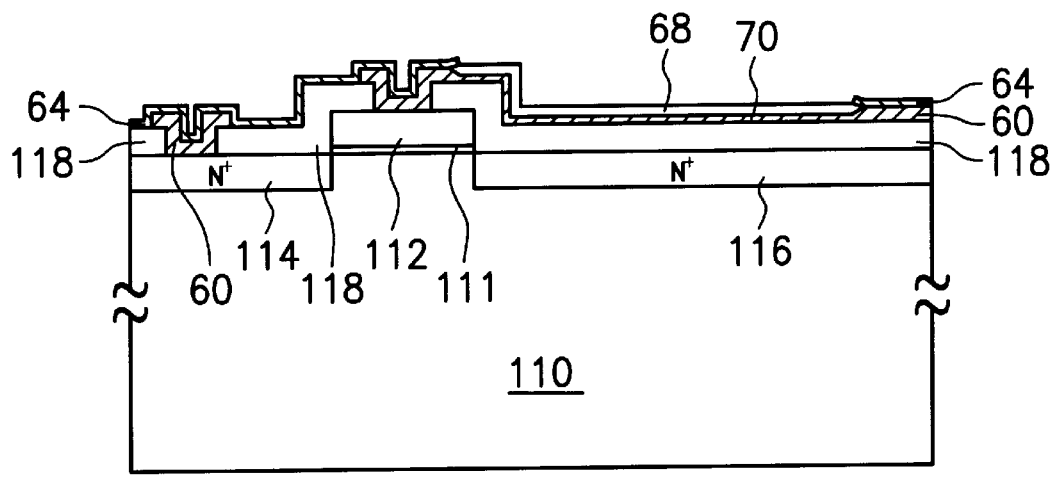
Figure 2O:
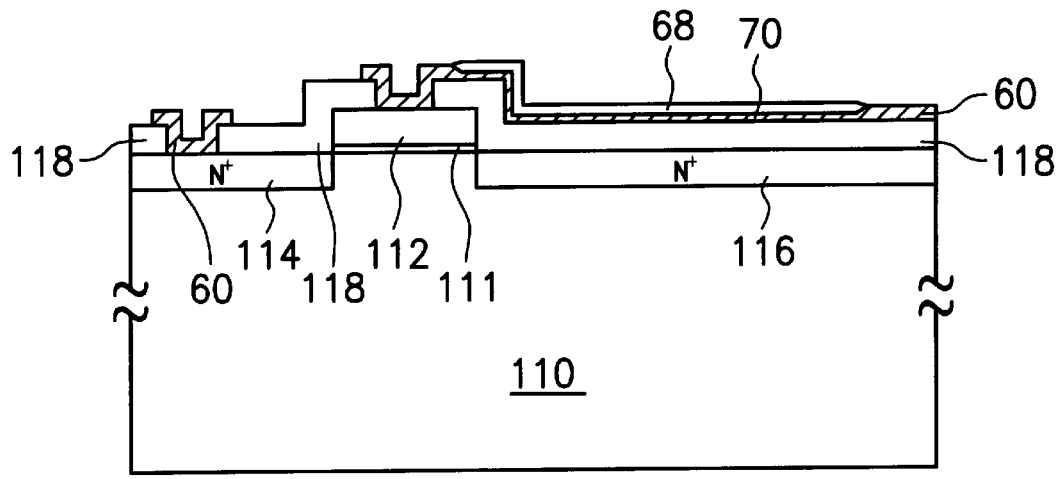
Figure 2P:
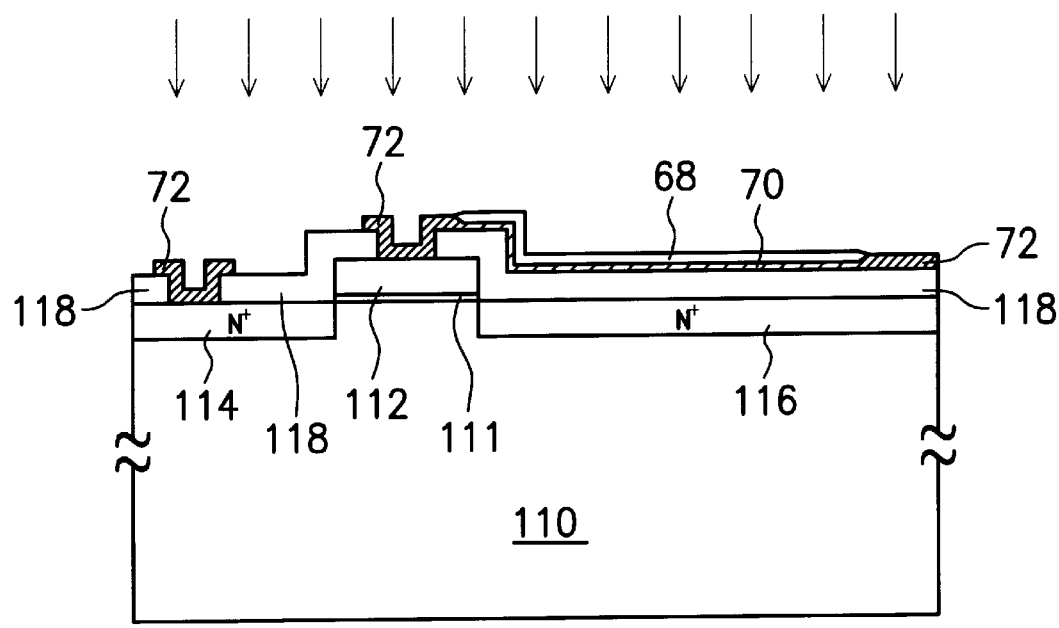

Reference will now be made in detail to the present preferred embodiments of the invention, examples of which are illustrated in the accompanying drawings. Wherever possible, the same reference numbers are used in the drawings and the description to refer to the same or like parts.

Figure 3A:
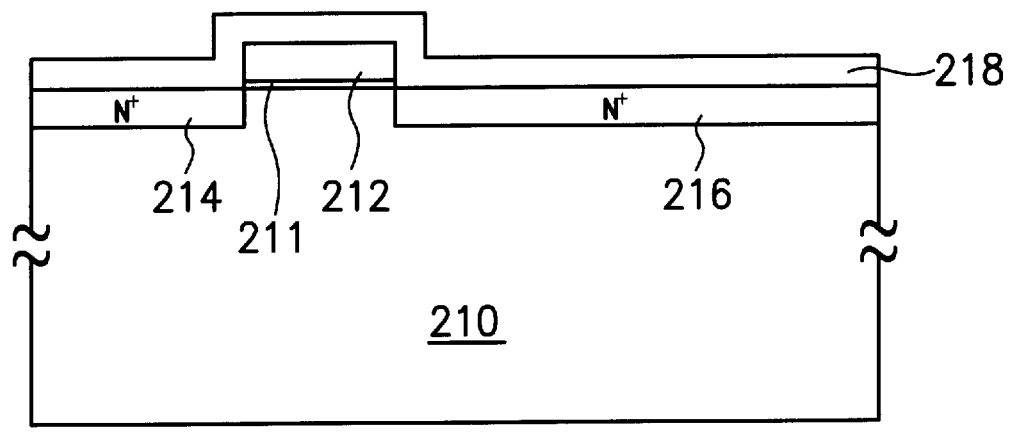
FIGS. 3A through 3N are cross-sectional views showing the progression of manufacturing steps in fabricating an SRAM polyload resistor according to one preferred embodiment of this invention.
Figure 3B:
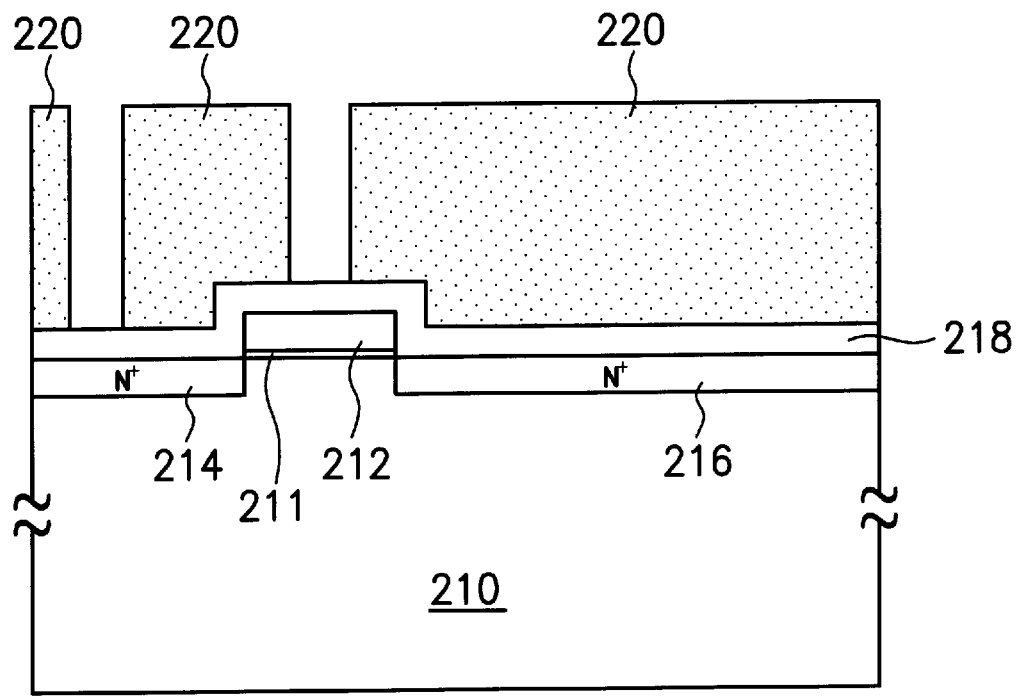
Figure 3C:
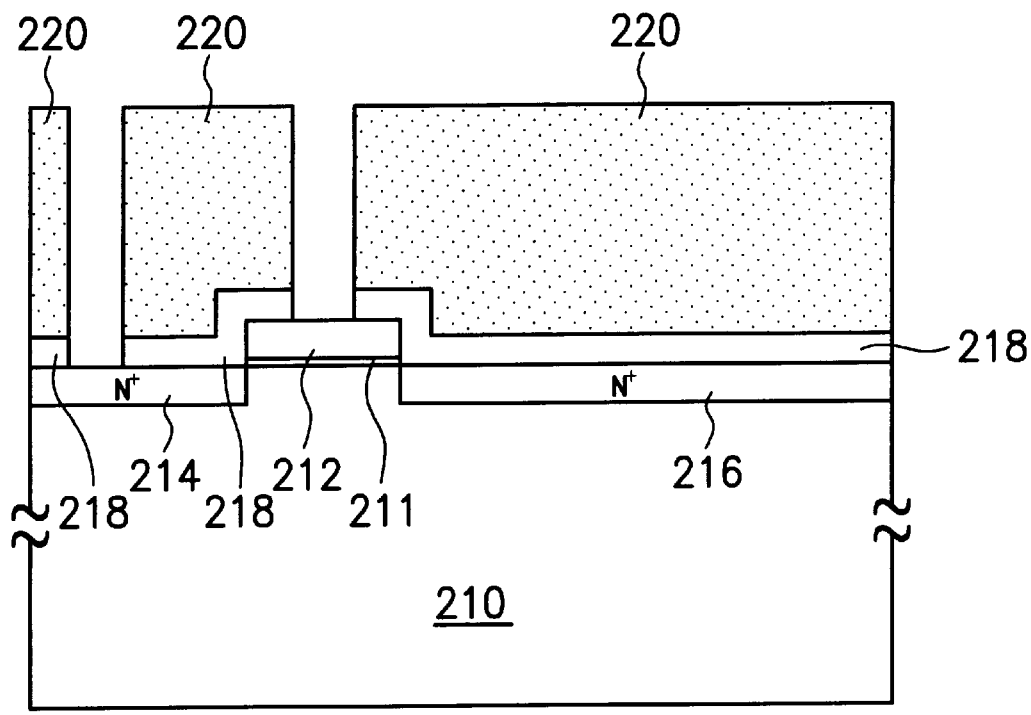
Figure 3D:
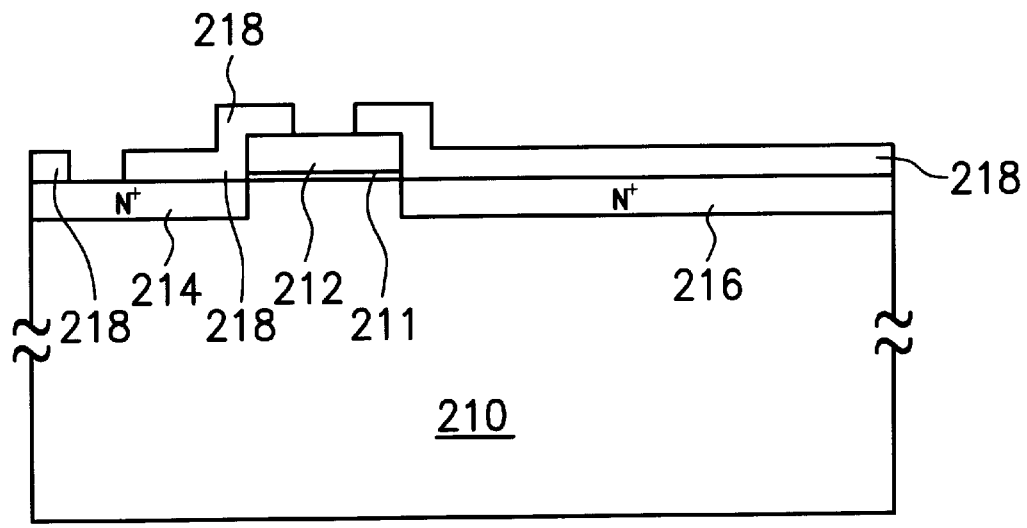
Figure 3E:
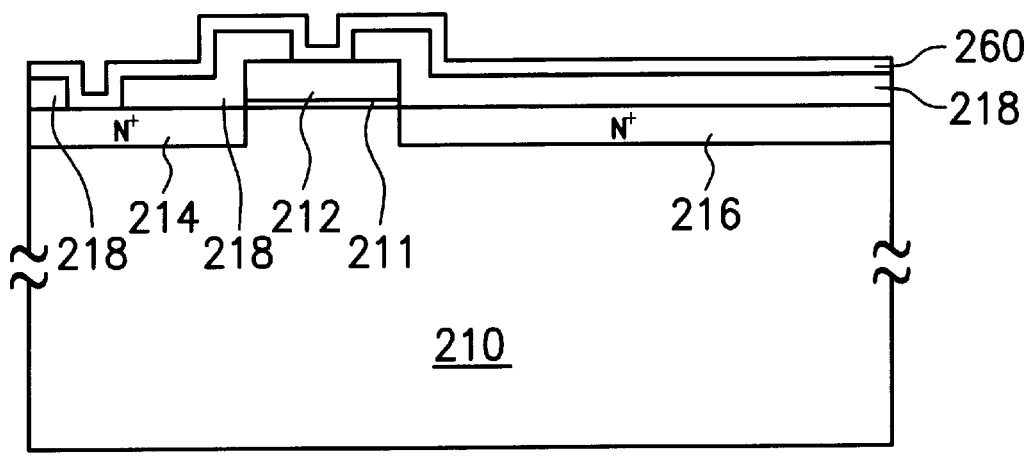
Figure 3F:
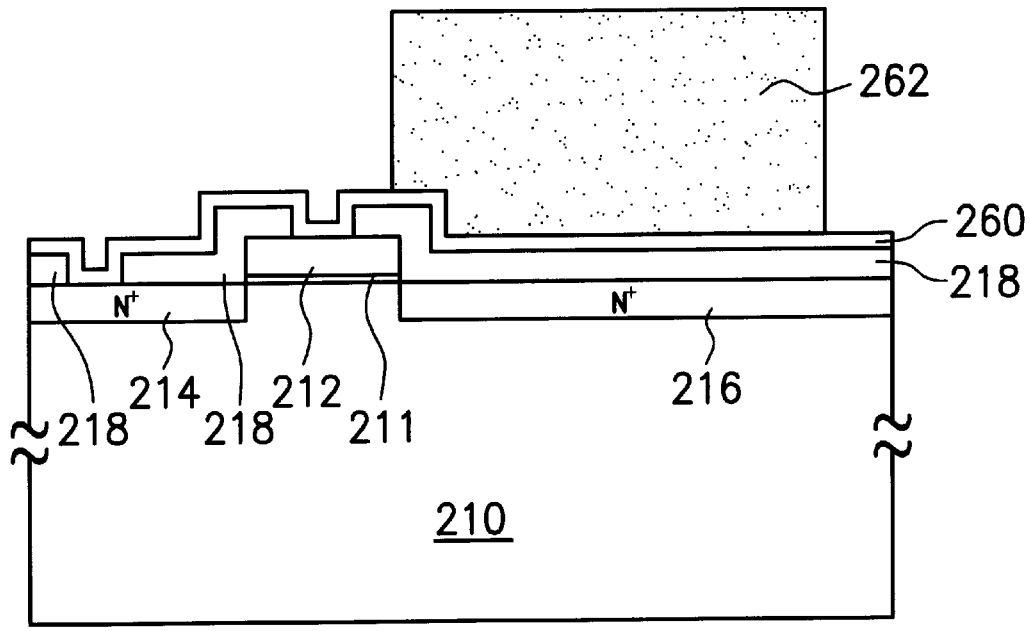
Figure 3G:
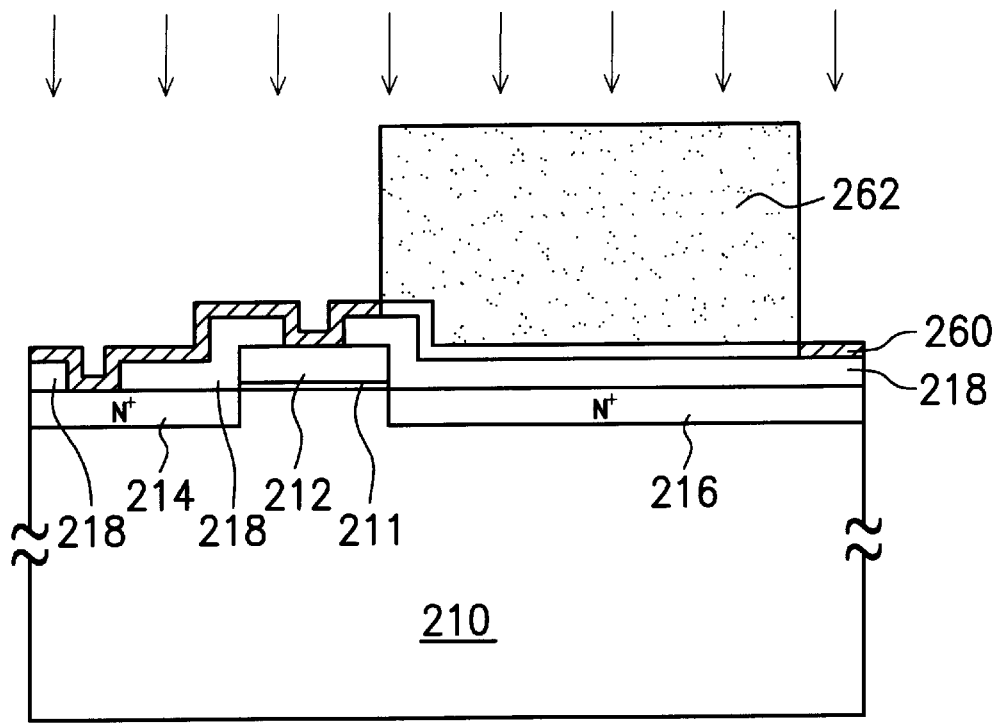
Figure 3H:
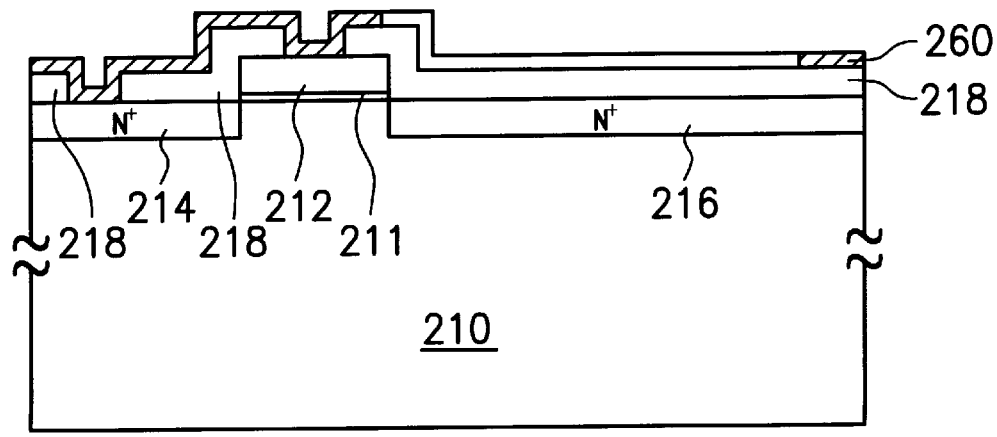
Figure 3I:
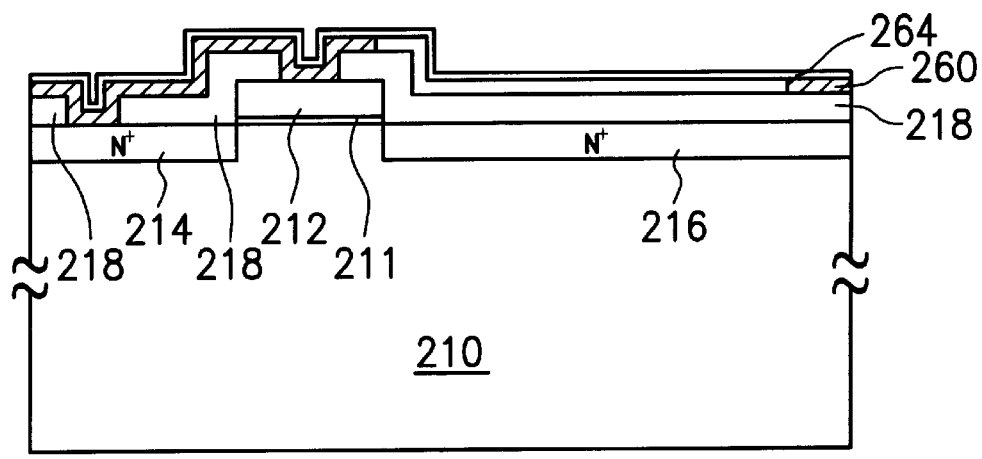
Figure 3J:
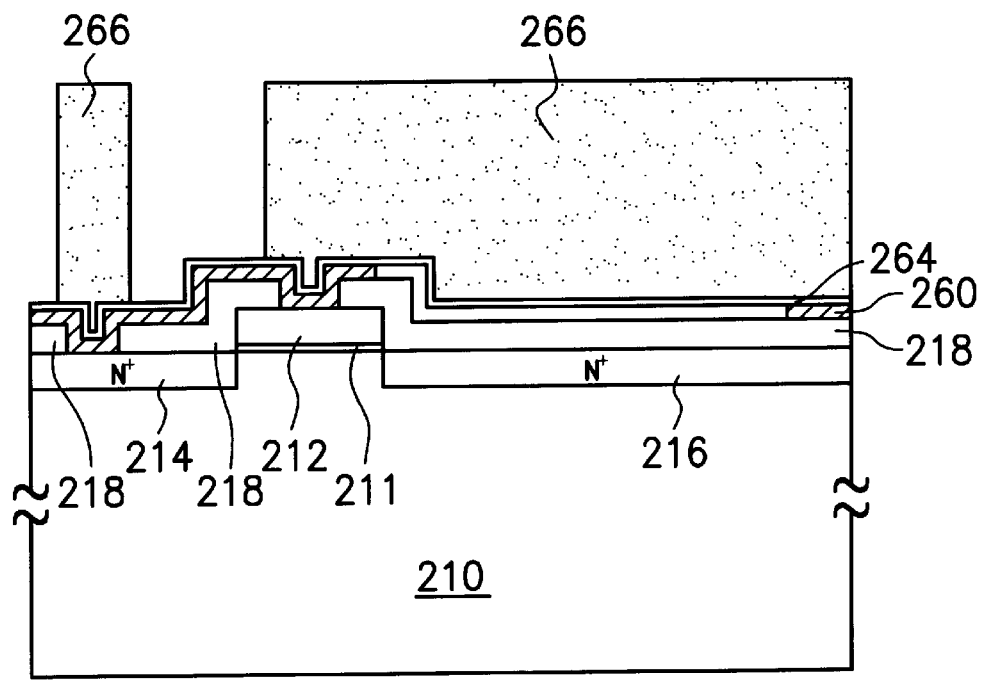
Figure 3K:
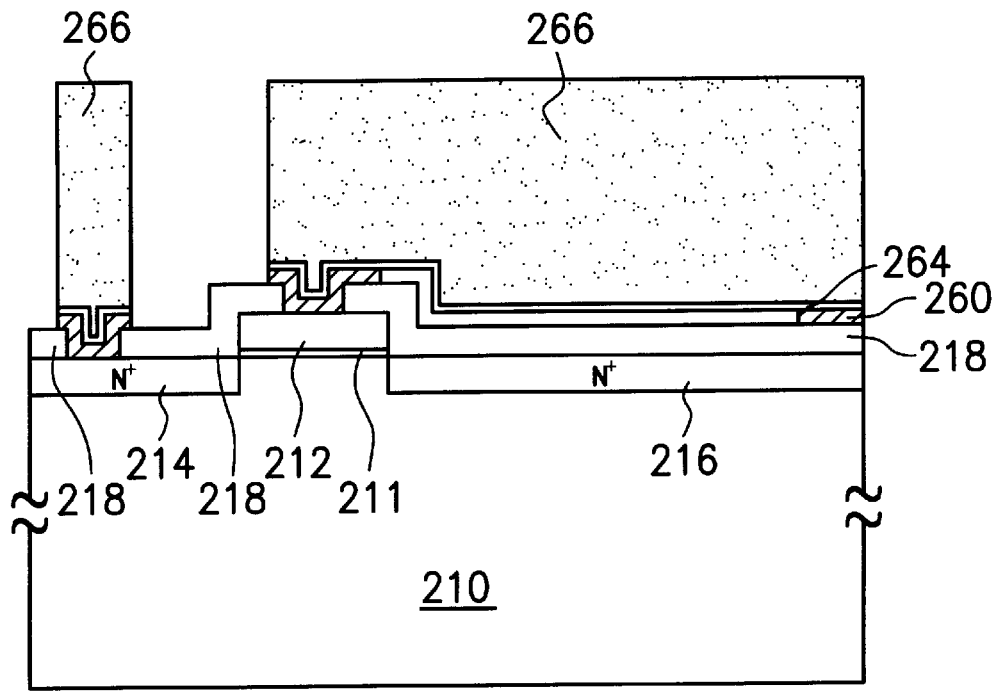
Figure 3L:
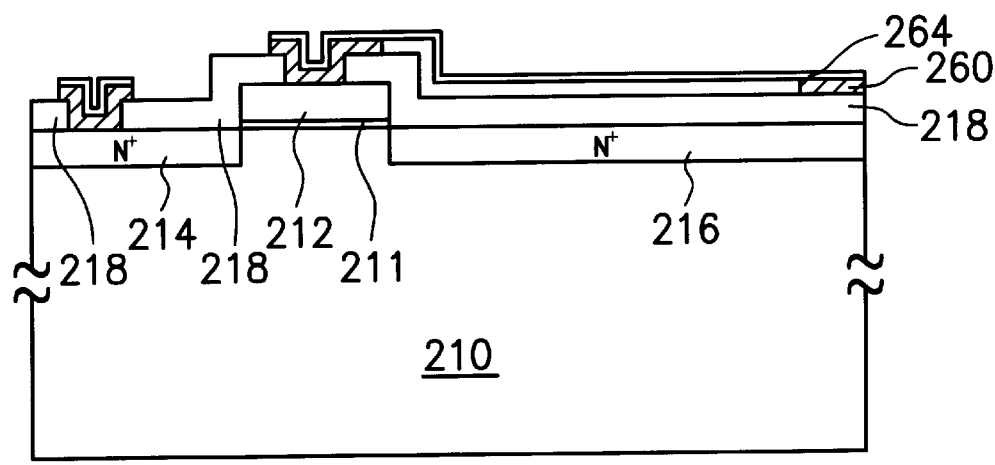
Figure 3M:
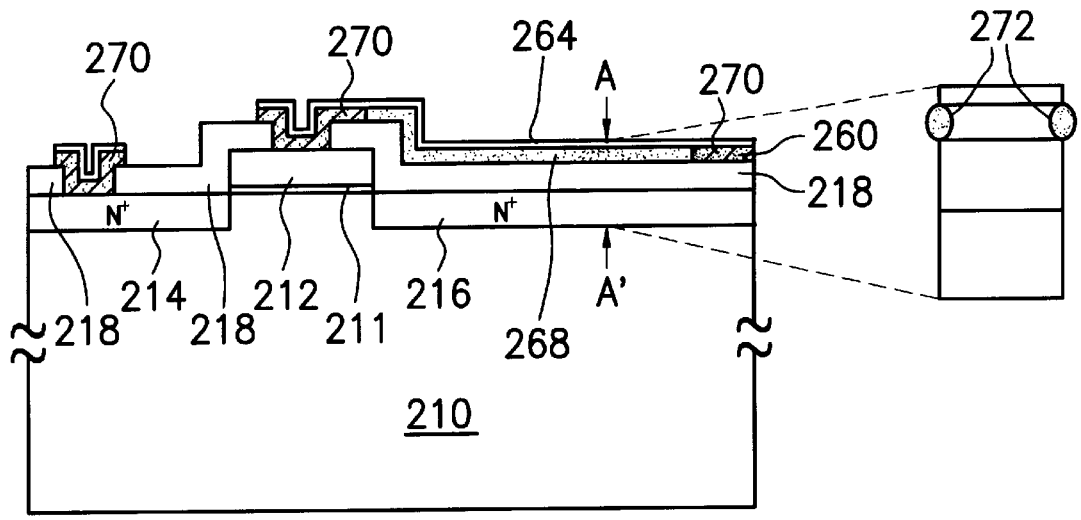
Figure 3N:
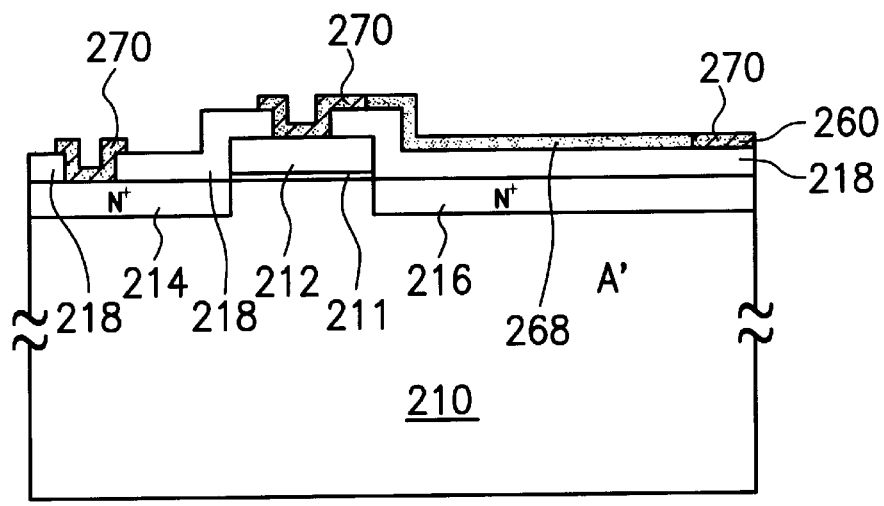

FIGS. 3A through 3N are cross-sectional views showing the progression of manufacturing steps in fabricating an SRAM polyload resistor according to one preferred embodiment of this invention.

First, as shown in FIG. 3A, a semiconductor substrate 210 is provided. Then, using a conventional fabricating method, a transistor component is formed over the substrate 210. The transistor component comprises a gate terminal 212, a gate dielectric layer 211 and N$^+$source/drain regions 214 and 216. The gate dielectric layer 211, preferably having a thickness of about 30 Å to 200 Å, is located between the gate terminal 212 and the substrate 210, and can be formed by thermal oxidation. The gate terminal 212, preferably having a thickness of about 1500 Å to 4500 Å, can be a highly doped polysilicon layer formed by chemical vapor deposition. Thereafter, a dielectric layer 218, preferably having a thickness of about 50 Å to 5000 Å, is formed over the semiconductor substrate 210. The dielectric layer can be a silicon dioxide layer formed by chemical vapor deposition.

Next, as shown in FIG. 3B, a photolithographic process is used to form a patterned first photoresist layer 220 exposing a portion of the dielectric layer 218.

Next, as shown in FIG. 3C, the exposed dielectric layer 218 is etched to form vias above the source/drain region 214 and the gate terminal 212. The etching can be done anisotropically using $CHF_3/CF_4$ as the gaseous etchant. Thereafter, as shown in FIG. 3D, the first photoresist layer 220 is removed.

Next, as shown in FIG. 3E, a polysilicon layer 260 is formed above the dielectric layer 218. The polysilicon layer 260 preferably has a thickness of about 300 Å to 3000 Å, and is formed by chemical vapor deposition.

Subsequently, as shown in FIG. 3F, a photolithographic process is used to form a patterned second photoresist layer 262 over the polysilicon layer 260 exposing a portion of the polysilicon layer 260.

Next, as shown in FIG. 3G, polysilicon layer 260 is doped with ions to adjust its resistance value. The ion-doped regions become the interconnect regions, and the undoped regions become load resistor regions. Ions used in the doping operation can be arsenic ions, phosphorus ions, boron difluoride ions or boron ions. The energy level used for implanting the ions is preferably in the range from 5 KeV to 150 KeV, and its dosage is about $1 \times 10^{13}$ to $3 \times 10^{14}$ ions/cm$^2$.

Next, as shown in FIG. 3H, the second photoresist layer 262 is removed. Thereafter, as shown in FIG. 3I, a chemical vapor deposition method is used to deposit silicon nitride to a thickness of about 200 Å to 2000 Å over the polysilicon layer 260 which functions as an anti-oxidation layer 264. The anti-oxidation layer 264 is primarily used to protect the polysilicon layer 260 against oxidation in a top-down (vertical) direction.

Next, as shown in FIG. 3J, a photolithographic process is used to form a patterned third photoresist layer 266 over the anti-oxidation layer 264 exposing a portion of the anti-oxidation layer 264.

Next, as shown in FIG. 3K, portions of anti-oxidation layer 264 and the exposed polysilicon layer 260 are etched such that the anti-oxidation layer 264 and the polysilicon layer 260 lying between the source/drain region 214 and the gate 212 is removed to form an open circuit.

Next, as shown in FIG. 3L, the third photoresist layer 266 is removed. Subsequently, as shown in FIG. 3M, the polysilicon layer 260 that lies underneath the anti-oxidation layer 264 is oxidized laterally. The lateral oxidation is preferably carried out at a temperature between 800°C. to 1100°C. in a moist and oxygen-filled chamber using a local oxidation of silicon (LOCOS) method. After the lateral oxidation, width of the polysilicon layer 260 underneath the anti-oxidation layer 264 becomes narrower, thereby forming the load resistor region 268 and the interconnect region 270. To prevent the resistance in the interconnect region 270 from dropping due to a narrowing of the polysilicon layer 260, one method is to implant a heavy dose of ions into the polysilicon layer 260 during the previous ion implantation step.

FIG. 3M also shows a cross-sectional view along direction AA'. From the figure, the oxide layer 272 on each side of the polysilicon layer 260 can be easily recognized.

Finally, as shown in FIG. 3N, the anti-oxidation layer 264 is removed using boiling phosphoric acid with 85 wt % and at a temperature of about 180°C.

In addition, the process of implanting ions into interconnect regions can be conducted after lateral oxidation of the polysilicon layer. This has the benefit of reducing the oxidation rate around the interconnect regions.

As a summary, the embodiment of this invention is similar to a conventional method in that the same polysilicon layer is used in the formation of interconnects and load resistors. In this invention, however, the interconnect region is ion-doped to lower its electrical resistance first, before a lateral oxidation is carried out to oxidize the two sides of the polysilicon layer. Consequently, the width of the polysilicon layer is narrowed, and its resistance is correspondingly increased. Moreover, only a lateral oxidation process is added to the later part of a conventional manufacturing cycle, and there is no need for additional mask-making and photolithographic processing operations. Since new arrangement of the manufacturing flow is unnecessary, incorporating this invention into a conventional production line does not incur an increase in the cost of production.

In addition, when employing the lateral oxidation method of this invention, a line width of about 0.2 µm for the polysilicon layer can easily be obtained (including the load resistor regions and the interconnect regions). Currently, it is as yet still very difficult to obtain a consistent line width of around 0.2 µm using a conventional photolithographic method.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating static random access memory polyload resistor comprising:

providing a semiconductor substrate having a transistor formed thereon, wherein the transistor includes a gate terminal, a source region and a drain region;

forming a dielectric layer over the substrate;

removing a portion of the dielectric layer using photolithographic and etching operations to form a plurality of vias;

forming a polysilicon layer over the substrate;

patterning the polysilicon layer using photolithographic and etching operations, and then doping ions into the exposed polysilicon layer to form a doped polysilicon layer;

forming an anti-oxidation layer over the substrate;

removing a portion of the polysilicon layer and a portion of the anti-oxidation layer using photolithographic and etching operations to form an interconnect region and a load resistor region;

performing a thermal oxidation; and removing the anti-oxidation layer.

2. The method of claim 1, wherein the step of forming the polysilicon layer includes a chemical vapor deposition method.

3. The method of claim 2, wherein the polysilicon layer has a thickness of about 300 Å to 3000 Å.

4. The method of claim 1, wherein ions are doped into the polysilicon layer for reducing its resistance.

5. The method of claim 4, wherein the step of doping the polysilicon layer includes implanting arsenic ions.

6. The method of claim 4, wherein the step of doping the polysilicon layer includes implanting phosphorus ions.

7. The method of claim 4, wherein the step of doping the polysilicon layer includes implanting boron difluoride ions.

8. The method of claim 4, wherein the step of doping the polysilicon layer includes implanting boron ions.

9. The method of claim 4, wherein the step of doping the polysilicon layer includes implanting with an energy level of between 5 KeV to 150 KeV.

10. The method of claim 4, wherein the step of doping the polysilicon layer includes implanting with a dose level of between $1 \times 10^{13}$ to $3 \times 10^{14}$ ions/cm$^2$.

11. The method of claim 1, wherein the step of forming the anti-oxidation layer includes depositing silicon nitride using a chemical vapor deposition method.

12. The method of claim 11, wherein the anti-oxidation layer has a thickness of about 200 Å to 2000 Å.

13. The method of claim 1, wherein the step of performing thermal oxidation includes a wet oxygen oxidizing method.

14. The method of claim 1, wherein the thermal oxidation is a lateral oxidation of the polysilicon layer underneath the anti-oxidation layer so that the width of the polysilicon layer is reduced and its resistance increased.

15. The method of claim 13, wherein the step of performing thermal oxidation includes heating to a temperature of between 800°C. to 1100°C.

16. The method of claim 1, wherein the anti-oxide layer over the polysilicon layer serves to protect the polysilicon layer against oxidation in a top-down direction.

17. A method for fabricating static random access memory polyload resistor comprising:

providing a semiconductor substrate having a transistor formed thereon, wherein the transistor includes a gate terminal, a source region and a drain region;

forming a dielectric layer over the substrate;

removing a portion of the dielectric layer using photolithographic and etching operations to form a plurality of vias;

forming a polysilicon layer over the substrate;

forming an anti-oxidation layer over the substrate;

removing a portion of the polysilicon layer and a portion of the anti-oxidation layer using photolithographic and etching operations to form an interconnect region and a load resistor region;

performing a thermal oxidation;

removing the anti-oxidation layer; and patterning the polysilicon layer using photolithographic and etching operations, and then doping ions into the exposed polysilicon layer in the interconnect region.

18. The method of claim 17, wherein the step of forming the polysilicon layer includes a chemical vapor deposition method.

19. The method of claim 18, wherein the polysilicon layer has a thickness of about 300 Å to 3000 Å.

20. The method of claim 17, wherein ions are doped into the polysilicon layer for reducing its resistance.

21. The method of claim 20, wherein the step of doping the polysilicon layer includes implanting arsenic ions.

22. The method of claim 20, wherein the step of doping the polysilicon layer includes implanting phosphorus ions.

23. The method of claim 20, wherein the step of doping the polysilicon layer includes implanting boron difluoride ions.

24. The method of claim 20, wherein the step of doping the polysilicon layer includes implanting boron ions.

25. The method of claim 20, wherein the step of doping the polysilicon layer includes implanting with an energy level of between 5 KeV to 150 KeV.

26. The method of claim 20, wherein the step of doping the polysilicon layer includes implanting with a dose level of between $1\times10^{13}$ to $3\times10^{14}$ ions/cm$^2$.

27. The method of claim 17, wherein the step of forming the anti-oxidation layer includes depositing silicon nitride using a chemical vapor deposition method.

28. The method of claim 27, wherein the anti-oxidation layer has a thickness of about 200 Å to 2000 Å.

29. The method of claim 17, wherein the step of performing thermal oxidation includes a wet oxygen oxidizing method.

30. The method of claim 17, wherein the thermal oxidation is a lateral oxidation of the polysilicon layer underneath the anti-oxidation layer so that the width of the polysilicon layer is reduced and its resistance increased.

31. The method of claim 29, wherein the step of performing thermal oxidation includes heating to a temperature of between 800°C. to 1100°C.

32. The method of claim 17, wherein the anti-oxide layer over the polysilicon layer fuinctions to protect the polysilicon layer against oxidation in a top-down direction.

* * * * *

UNITED STATES PATENT AND TRADEMARK OFFICE
CERTIFICATE OF CORRECTION

PATENT NO. : 6,015,728

DATED : January 18, 2000

INVENTOR(S) : Chou

It is certified that error appears in the above-identified patent and that said Letters Patent is hereby corrected as shown below:

In column 1, line 9, delete "FEILD OF INVENTION" and insert -- FIELD OF INVENTION --.

In column 4, line 2, delete "1500 Åto 4500 Å," and insert -- 1500 Å to 4500 Å, --.

In column 4, line 5, delete "50 Åto 5000 Å," and insert -- 50 Å to 5000 Å, --.

In column 4, line 19, delete "300 Åto 3000 Å," and insert -- 300 Å to 3000 Å, --.

In column 4, line 37 delete "200 Åto 2000 Åover the" and insert -- 200 Å to 2000 Å over the --.

In column 5, line 63, delete "about 300 Åto 3000 Å." and insert -- about 300 Å to 3000 Å. --.

In column 6, line 21, delete "about 200 Åto 2000 Å." and insert -- about 200 Å to 2000 Å. --.

UNITED STATES PATENT AND TRADEMARK OFFICE
CERTIFICATE OF CORRECTION

PATENT NO. : 6,015,728
DATED : January 18, 2000
INVENTOR(S) : Chou

It is certified that error appears in the above-identified patent and that said Letters Patent is hereby corrected as shown below:

In column 6, line 58, delete "about 300 Åto 3000 Å." and insert -- about 300 Å to 3000 Å. --.

In column 7, line 13, delete "about 200 Åto 2000 Å." and insert -- about 200 Å to 2000 Å. --.

Signed and Sealed this

Tenth Day of April, 2001

Attest:

NICHOLAS P. GODICI

Attesting Officer

Acting Director of the United States Patent and Trademark Office